US007541947B2

(12) United States Patent  (10) Patent No.: US 7,541,947 B2
Bae et al.  (45) Date of Patent: Jun. 2, 2009

(54) SEMICONDUCTOR DEVICES, A SYSTEM INCLUDING SEMICONDUCTOR DEVICES AND METHODS THEREOF

(75) Inventors: Seung-Jun Bae, Daejeon (KR); Seong-Jin Jang, Seongnam-si (KR); Kwang-Il Park, Yongin-si (KR); Woo-Jin Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/802,886

(22) Filed: May 25, 2007

(65) Prior Publication Data

US 2007/0290902 A1   Dec. 20, 2007

(30) Foreign Application Priority Data

May 27, 2006  (KR) .................... 10-2006-0047857

(51) Int. Cl.
*H03M 7/00* (2006.01)
(52) U.S. Cl. .............................. 341/60; 341/58; 341/61; 341/95; 714/759; 714/777; 714/793; 714/802; 375/286; 375/294
(58) Field of Classification Search .............. 341/58, 341/61, 95, 100–104; 714/802, 759, 793, 714/777; 375/286–294
See application file for complete search history.

(56) References Cited

U.S. PATENT DOCUMENTS

| 5,841,378 | A  | * | 11/1998 | Klayman et al. ............... 341/61 |
| 6,388,590 | B1 | * | 5/2002  | Ng .............................. 341/100 |
| 6,628,725 | B1 | * | 9/2003  | Adam et al. ................. 375/259 |
| 6,703,949 | B2 |   | 3/2004  | Greenstreet |
| 6,734,811 | B1 |   | 5/2004  | Cornelius |
| 6,812,870 | B1 | * | 11/2004 | Kryzak et al. ................. 341/95 |
| 6,920,604 | B2 | * | 7/2005  | Coakeley et al. ............ 714/802 |
| 6,986,094 | B2 | * | 1/2006  | Grimsrud ..................... 714/759 |
| 7,055,073 | B2 | * | 5/2006  | Walker et al. ............... 714/701 |
| 7,180,958 | B2 | * | 2/2007  | Bessios et al. ............. 375/286 |
| 7,274,315 | B2 | * | 9/2007  | Baumer ....................... 341/95 |
| 2002/0129307 | A1 | * | 9/2002 | Walker et al. ............... 714/715 |
| 2004/0088633 | A1 | * | 5/2004 | Lida et al. ................... 714/752 |
| 2007/0101241 | A1 | * | 5/2007 | Hoyer ........................ 714/776 |
| 2007/0165698 | A1 | * | 7/2007 | Haque et al. ................ 375/141 |

FOREIGN PATENT DOCUMENTS

KR   10-2004-0012677   2/2004

* cited by examiner

*Primary Examiner*—Linh V Nguyen
(74) *Attorney, Agent, or Firm*—Harness, Dickey & Pierce, P.L.C.

(57) ABSTRACT

Semiconductor devices, a system including said semiconductor devices and methods thereof are provided. An example semiconductor device may receive data scheduled for transmission, scramble an order of bits within the received data, the scrambled order arranged in accordance with a given pseudo-random sequence. The received data may be balanced such that a difference between a first number of the bits within the received data equal to a first logic level and a second number of bits within the received data equal to a second logic level is below a threshold. The balanced and scrambled received data may then be transmitted. The example semiconductor device may perform the scrambling and balancing operations in any order. Likewise, on a receiving end, another semiconductor device may decode the original data by unscrambling and unbalancing the transmitted data. The unscrambling and unbalancing operations may be performed in an order based upon the order in which the transmitted data is scrambled and balanced.

21 Claims, 15 Drawing Sheets

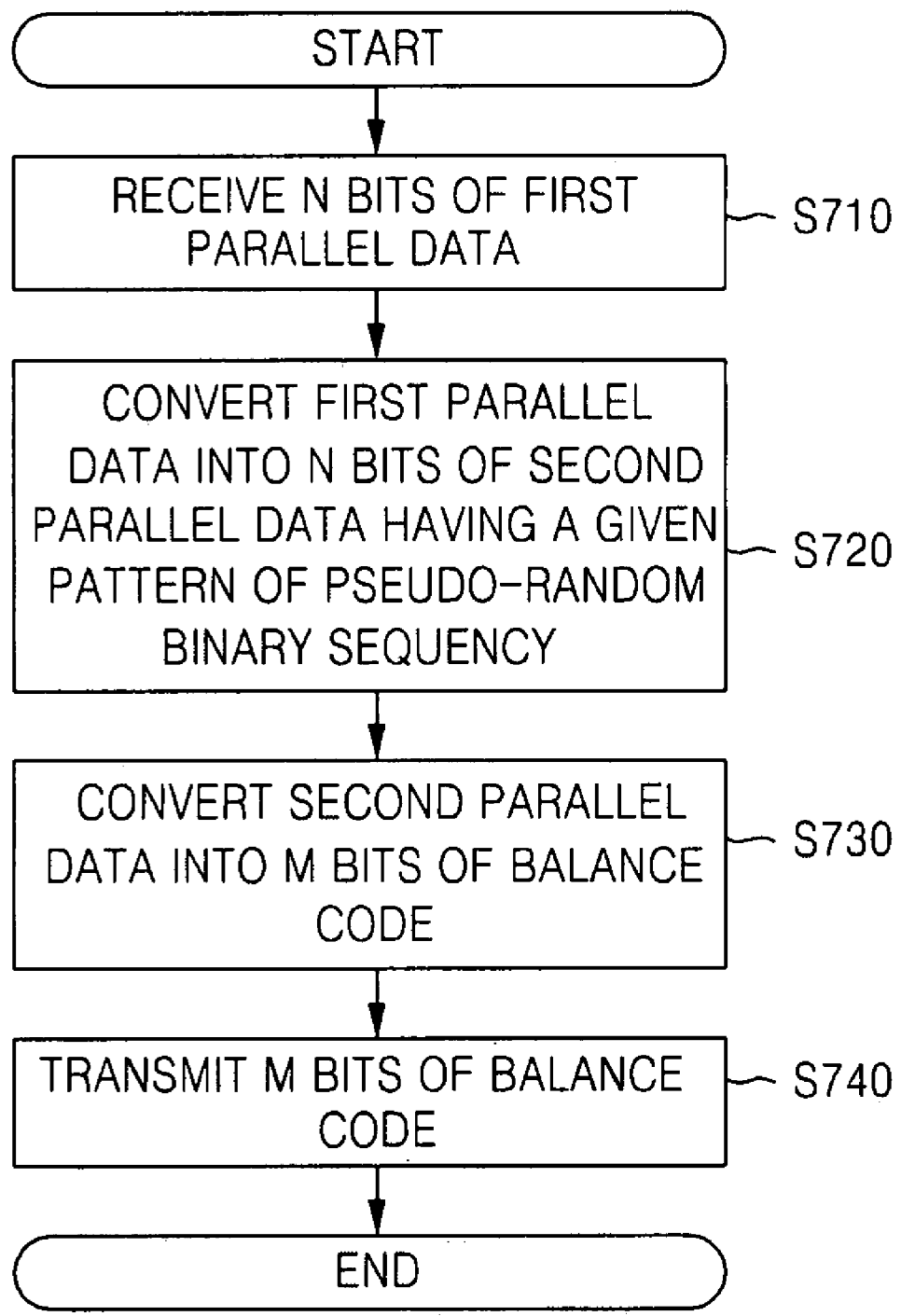

US 7,541,947 B2

SEMICONDUCTOR DEVICES, A SYSTEM INCLUDING SEMICONDUCTOR DEVICES AND METHODS THEREOF

This application claims the priority of Korean Patent Application No. 10-2006-0047857, filed on May 27, 2006, in the Korean Intellectual Property Office, the disclosure of which is incorporated herein in its entirety by reference.

BACKGROUND OF THE INVENTION

1. Field of the Invention

Example embodiments of the present invention relate generally to semiconductor devices, a system including semiconductor devices and methods thereof, and more particularly to semiconductor devices, a system including semiconductor devices and methods of reducing noise.

2. Description of the Related Art

Noise may occur due to parasitic inductance in a parallel input/output circuit of a semiconductor device (e.g., a dynamic random access memory (DRAM) device or a controller) using single-ended parallel transmission for a single-ended interface.

FIG. 1 is a schematic diagram of a conventional single-ended parallel interface system 10. The single-ended parallel interface system 10 may include a first semiconductor device 20 having a transmitter 21 and a plurality of transmission lines Line1 through LineN, and a second semiconductor device 30 having a receiver 31. The transmitter 21 may include a plurality of transmission drivers 101 through 10N. The receiver 31 may include a plurality of amplifiers 201 through 20N and a plurality of terminating resistors R1 through RN.

Referring to FIG. 1, the total amount of current consumed by the transmission drivers 101 through 10N may vary based on values DQ1 through DQN of N bits of parallel data transmitted through the transmission lines Line1 through LineN. Because parasitic inductance may occur between internal power supply nodes VDDQ and VSSQ and respective board power supply nodes VDD and VSS, a change in current flowing due to the parasitic inductance may raise noise (e.g., jitter, voltage noise, or reference fluctuation) in the internal power supply nodes VDDQ and VSSQ. The noise may be proportional to the variation in current flowing in all channels (e.g., the transmission lines Line1 through LineN). Such noise may also reduce the voltage margin and the time margin of a signal, limiting a transmission rate or frequency.

Referring to FIG. 1, in order to reduce noise, differential signaling, in which a substantially constant current is consumed, may be employed. However, differential signaling may require additional pins (e.g., twice as many pins) as compared to single-ended signaling.

Another conventional process for reducing noise may be DC balance coding. FIG. 2 illustrates a conventional single-ended parallel interface system 200 using DC balance coding. The single-ended parallel interface system 200 may include a first semiconductor device 210 and a second semiconductor device 220.

Referring to FIG. 2, the first semiconductor device 210 may include a core block 211, a balance encoding block 212 and an output driver 213. The core block 211 may store given first parallel data. The balance encoding block 212 may receive and encode the first parallel data from the core block 211 and may output second parallel data. The output driver 213 may receive the second parallel data and may output the received second parallel data to the second semiconductor device 220.

Referring to FIG. 2, the second semiconductor device 220 may include a receiver 221, a decoding block 222 and a data storage unit 223. The receiver 221 may receive an output from the output driver 213. The decoding block 222 may decode parallel data output from the receiver 221 to restore the first parallel data. The data storage unit 223 may store the restored first parallel data.

Referring to FIG. 2, the balance encoding block 212 may perform encoding using the DC balance coding. Examples of DC balance coding may be 8B/10B coding and data bus inversion (DBI) coding. In conventional 8B/10B coding, 2 bits of data may be added to 8 bits of parallel data so that a number of bits set to a first logic level (e.g., a higher logic level or logic "1") may be similar to a number of bits set to a second logic level (e.g., a lower logic level or logic "0"). Thus, conventionally, a maximum difference between the number of bits set to the first and second logic levels may typically be set to be 2 in a DC balance code having 10-bit parallel data such that noise occurring in the internal power supply nodes VDDQ and VSSQ may be reduced to a quarter.

Referring to FIG. 2, in conventional DBI coding, the number of bits set to the first and second logic levels, respectively, may be calculated in N-bit (e.g., 8-bit) parallel data. If the calculated number bits set to the first or second logic level exceeds a threshold value "k" (e.g., where k≧4), the N-bit parallel data may be inverted and a first flag may be set to, for example, the first logic level (e.g., a higher logic level or logic "1") during coding.

In each of 8B/10B coding and DBI coding, the number of bits set to the first and second logic levels, respectively, in parallel data may be controlled to reduce the variation in current flowing in parasitic inductance between the internal power supply nodes VDDQ and VSSQ and the respective board power supply nodes VDD and VSS, thereby reducing noise. Accordingly, DC noise may be reduced using the conventional DC balance coding.

However, 8B/10B coding and DBI coding may not reduce switching noise occurring if an input bit value in parallel data changes temporally. For example, if a 10-bit balance code is converted from a first code of "0000011111" into a second code of "1111100000", each respective bit of the first code changes during the conversion, and therefore, noise caused by switching of input data values may increase.

SUMMARY OF THE INVENTION

An example embodiment of the present invention is directed to a method of reducing noise, including receiving first parallel data, the first parallel data including a first plurality of bits arranged in a first order, scrambling the first plurality of bits included among the first parallel data to obtain second parallel data having the first plurality of bits arranged in a second order and generating a balance code having a second plurality of bits by adding at least one additional bit to the first plurality of bits and adjusting a logic level of at least one of the first plurality of bits such that a difference between a first number of the second plurality of bits equal to a first logic level and a second number of the second plurality of bits equal to a second logic level is below a threshold.

Another example embodiment of the present invention is directed to a semiconductor device, including a scrambler receiving first parallel data, the first parallel data including a first plurality of bits arranged in a first order, and scrambling the first plurality of bits included among the first parallel data to obtain second parallel data having the first plurality of bits arranged in a second order and a balance coding block generating a balance code having a second plurality of bits by performing one of adding at least one additional bit to the first plurality of bits and adjusting a logic level of at least one of the first plurality of bits such that a difference between a first number of the second plurality of bits equal to a first logic level and a second number of the second plurality of bits equal to a second logic level is below a threshold.

Another example embodiment of the present invention is directed to a semiconductor device, including a data receiver receiving a balance code through a plurality of parallel data lines, the balance code including a second plurality of bits generated by scrambling a first plurality of bits arranged in a first order to generate the first plurality of bits arranged in a second order, and balancing the first plurality of bits arranged in the second order such that a difference between a first number of the second plurality of bits equal to a first logic level and a second number of the second plurality of bits equal to a second logic level is below a threshold, a balance decoding block decoding the received balance code so as to obtain the first plurality of bits arranged in the second order, a descrambler descrambling the extracted second plurality of bits so as to obtain the first plurality of bits arranged in the first order and a data storage unit storing the obtained first plurality of bits arranged in the first order.

Another example embodiment of the present invention is directed to a method of reducing noise, including receiving a balance code through a plurality of parallel data lines, the balance code including a second plurality of bits generated by scrambling a first plurality of bits arranged in a first order to generate a first plurality of bits arranged in a second order, and balancing the first plurality of bits arranged in the second order such that a difference between a first number of the second plurality of bits equal to a first logic level and a second number of the second plurality of bits equal to a second logic level is below a threshold, decoding the received balance code so as to obtain the first plurality of bits arranged in the second order, descrambling the extracted second plurality of bits so as to obtain the first plurality of bits arranged in the first order and storing the obtained first plurality of bits arranged in the first order.

Another example embodiment of the present invention is directed to a method of reducing noise, including receiving data scheduled for transmission, scrambling an order of bits within the received data, the scrambled order arranged in accordance with a given pseudo-random sequence, balancing the received data such that a difference between a first number of the bits within the received data equal to a first logic level and a second number of bits within the received data equal to a second logic level is below a threshold and transmitting the scrambled and balanced received data.

Another example embodiment of the present invention is directed to a method and system for reducing noise due to parasitic inductance and switching noise by combining a balance code to a scrambler during a coding of parallel data to be transmitted using a single-ended parallel interface and a balance code.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

FIG. 7 is a flowchart of a process of transmitting data using a single-ended parallel interface according to another example embodiment of the present invention.

DETAILED DESCRIPTION OF EXAMPLE EMBODIMENTS OF THE PRESENT INVENTION

Figure 1:
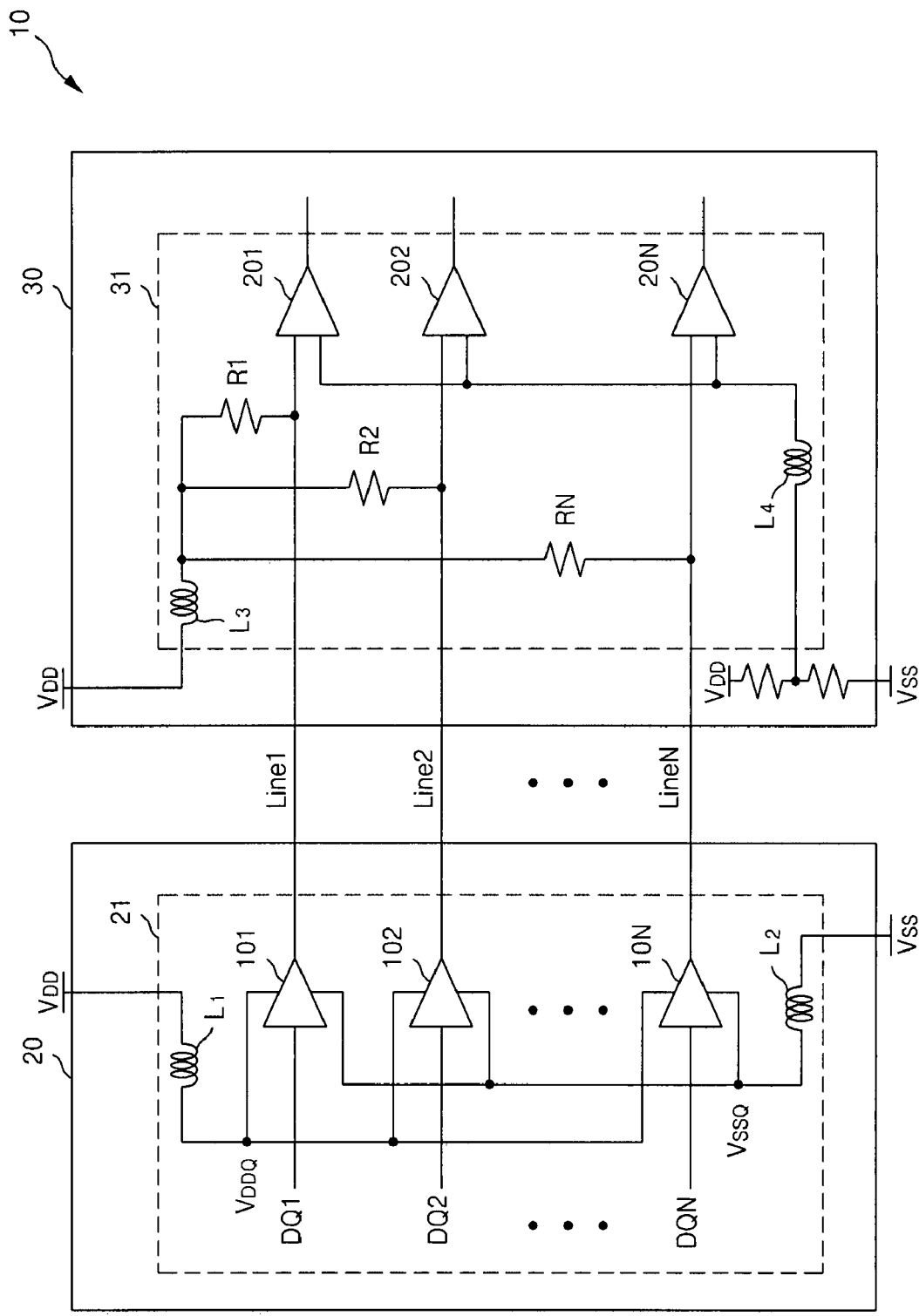
FIG. 1 is a schematic diagram of a conventional single-ended parallel interface system.
Figure 2:
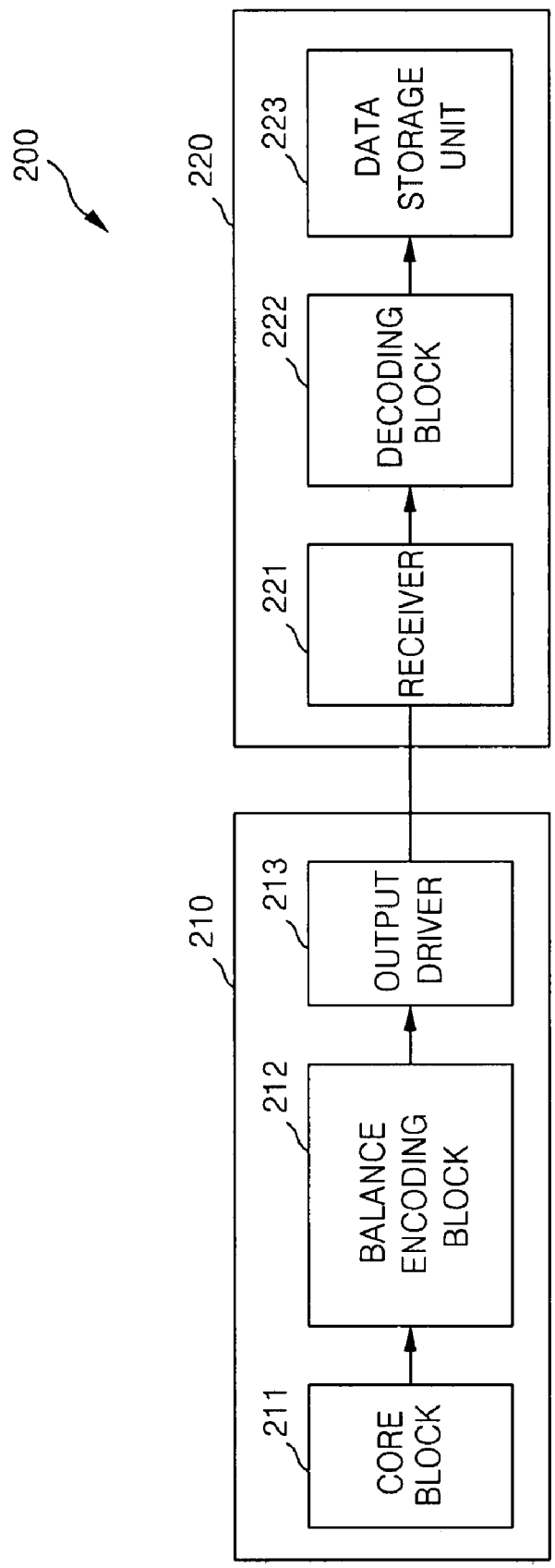
FIG. 2 illustrates a conventional single-ended parallel interface system using DC balance coding.

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
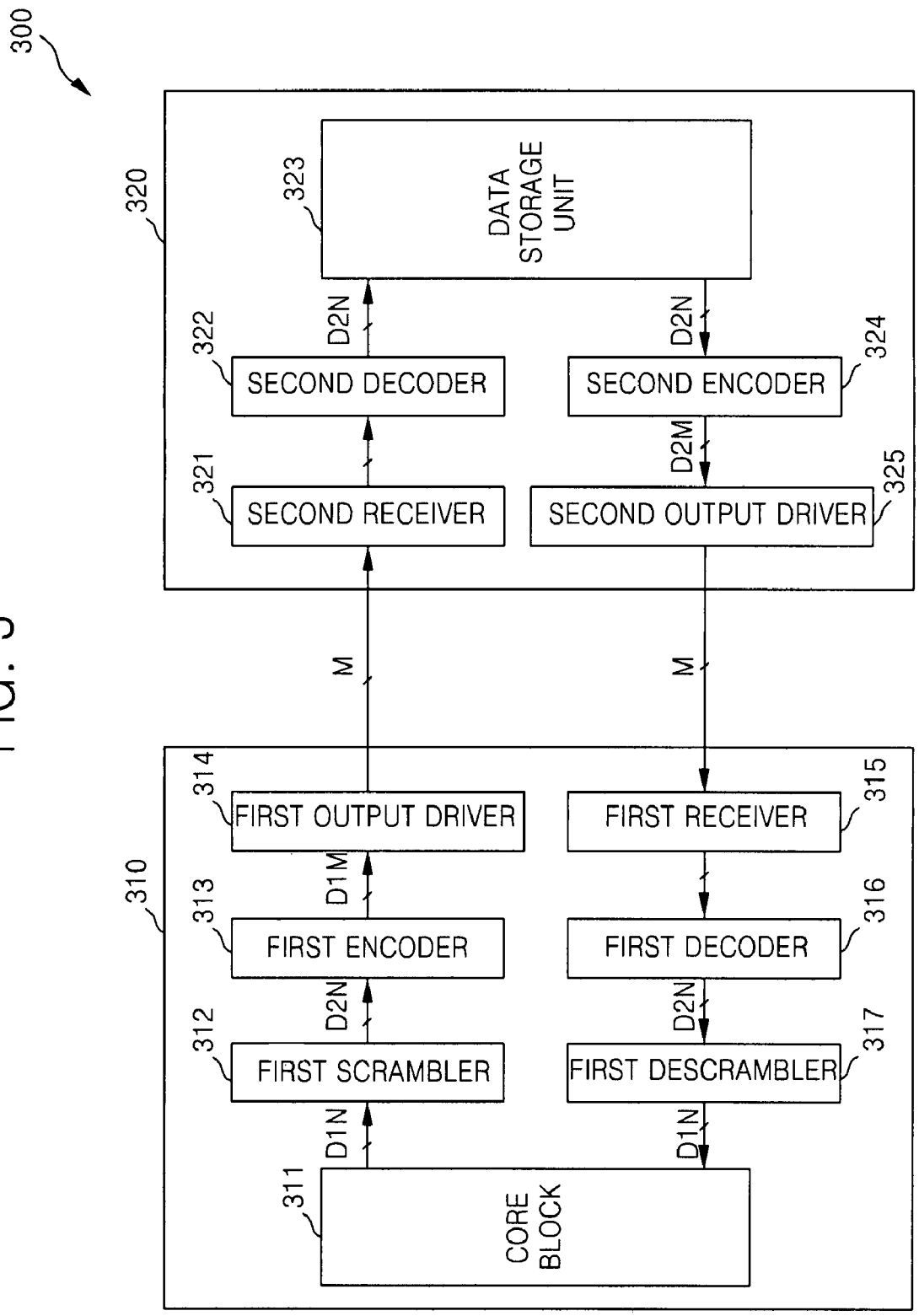
FIG. 3 illustrates a single-ended parallel interface system according to an example embodiment of the present invention.

FIG. 3 illustrates a single-ended parallel interface system 300 according to an example embodiment of the present invention. In the example embodiment of FIG. 3, the single-ended parallel interface system 300 may include a first semiconductor device 310 and a second semiconductor device 320. In an example, the first semiconductor device 310 may be embodied as a memory controller and the second semiconductor device 320 may be embodied as a memory device, such as a dynamic random access memory (DRAM), a static RAM (SRAM) or a flash memory. The first semiconductor device 310 may include a core block 311, a first scrambler 312, a first encoder 313, a first output driver 314, a first receiver 315, a first decoder 316 and a first descrambler 317.

In the example embodiment of FIG. 3, the core block 311 may include a micro processor (not shown) and an internal memory (not shown). The core block 311 may generate a command, an address, etc., which may be used during a write operation to write data to the second semiconductor device 320 (e.g., DRAM) or, alternatively, during a read operation to read data from the second semiconductor device 320 (e.g., DRAM).

In the example embodiment of FIG. 3, the first scrambler 312 may receive N bits (e.g., where N may equal an integer at least equal to 2) of first parallel data D1N from the core block 311 and may convert the N bits of first parallel data into N bits of second parallel data D2N having a given pattern of a pseudo-random binary sequence. For example, the first scrambler 312 may generate a pseudo-random binary sequence using the address, which may be transmitted to the second semiconductor device 320 (e.g., DRAM) in order to read or write data from or to the second semiconductor device 320, as a seed and may convert the first parallel data D1N into the second parallel data D2N having the given pattern of a pseudo-random binary sequence using the pseudo-random binary sequence.

In the example embodiment of FIG. 3, the first encoder 313 may receive the second parallel data D2N and may generate M bits of first balance code D1M. In an example, M may be an integer greater than N. The first encoder 313 may selectively convert the second parallel data D2N or, alternatively, may add at least one bit to the second parallel data D2N, to output M bits of the first balance code D1M in order to reduce a difference between the number of bits of set to a first logic level (e.g., a higher logic level or logic "1") and the number of bits set to a second logic level (e.g., a lower logic level or logic "0") to within a given range. For example, the first encoder 313 may generate the first balance code D1M using 8B/10B coding or data bus inversion (DBI) coding.

In the example embodiment of FIG. 3, the first output driver 314 may receive an output of the first encoder 313 and may transmit the received output to the second semiconductor device 320 (e.g., DRAM).

In the example embodiment of FIG. 3, the second semiconductor device 320 may include a second receiver 321, a second decoder 322, a data storage unit 323, a second encoder 324 and a second output driver 325. The second receiver 321 may receive parallel data from the first output driver 314. The second decoder 322 may decode an output of the second receiver 321 and may restore the second parallel data D2N. The data storage unit 323 may store the restored second parallel data D2N. The data storage unit 323 may be a memory cell array including a plurality of memory cells. In an example, the restored second parallel data D2N may be scrambled data.

In the example embodiment of FIG. 3, the second encoder 324 may receive the second parallel data D2N stored in the data storage unit 323 and may generate M bits of second balance code D2M. In an example, the second encoder 324 may generate the second balance code D2M using the same encoding scheme as the first encoder 313.

In the example embodiment of FIG. 3, the second output driver 325 may receive the second balance code D2M and may transmit the received second balance code D2M to the first semiconductor device 310 (e.g., a memory controller).

In the example embodiment of FIG. 3, the first receiver 315 in the first semiconductor device 310 may receive parallel data output from the second semiconductor device 320. The first decoder 316 may decode an output of the first receiver 315. The first descrambler 317 may descramble an output D2N of the first decoder 316. The descrambled output of the first descrambler 317 may be stored in the core block 313.

Figure 4:
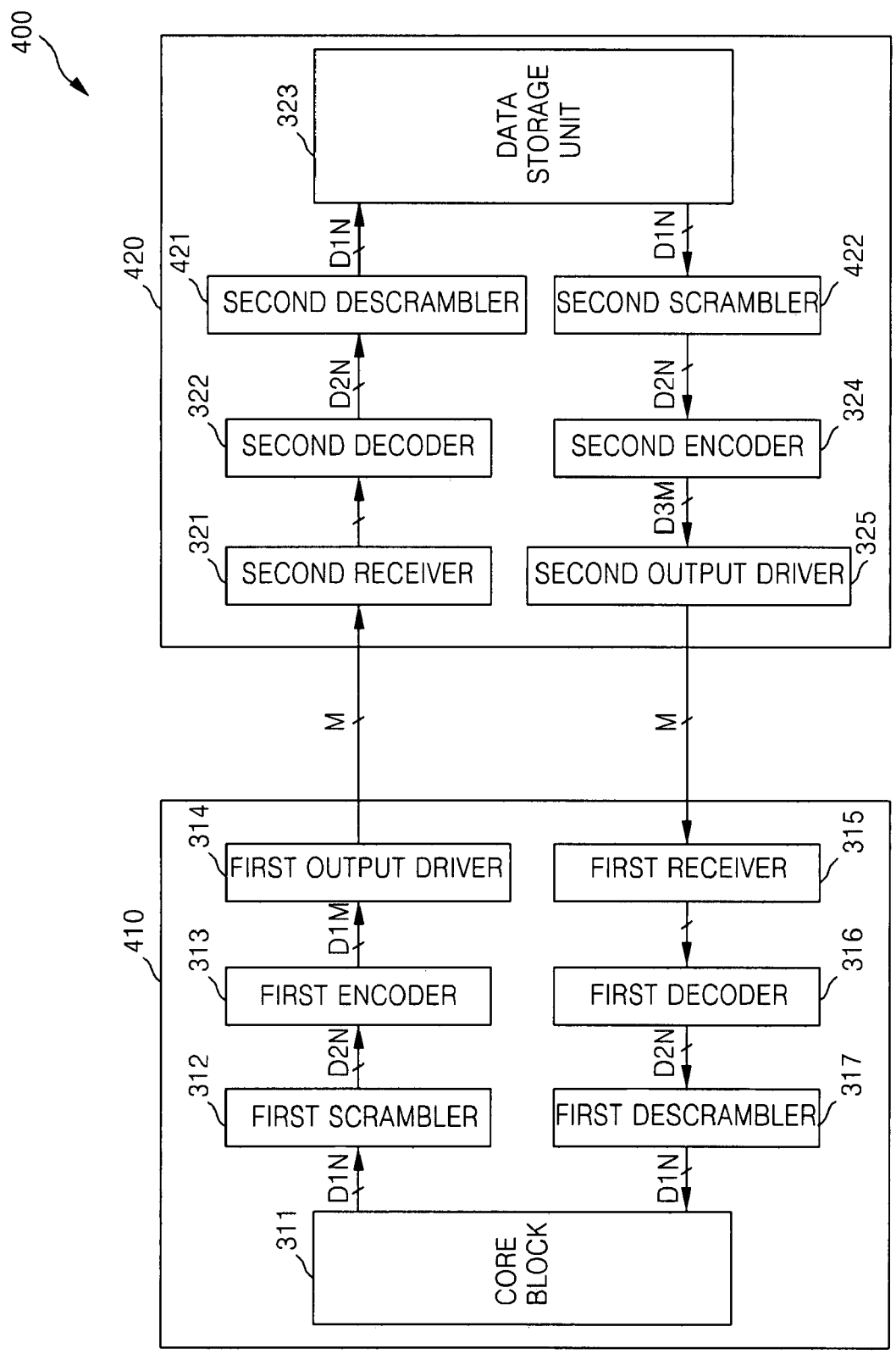
FIG. 4 illustrates a single-ended parallel interface system according to another example embodiment of the present invention.

FIG. 4 illustrates a single-ended parallel interface system 400 according to another example embodiment of the present invention. In the example embodiment of FIG. 4, the single-ended parallel interface system 400 may include semiconductor device 410 and 420. In the example embodiment of FIG. 4, the semiconductor device 410 may have the same structure as that of the first semiconductor device 310 illustrated in FIG. 3. Accordingly, a further description of the semiconductor device 410 has been omitted for the sake of brevity.

In the example embodiment of FIG. 4, the semiconductor device 420 may have a structure similar to that of the second semiconductor device 320 illustrated in FIG. 3, with the exception that the semiconductor device 420 may further include a second descrambler 421 and a second scrambler 423.

In the example embodiment of FIG. 4, the second receiver 321 in the semiconductor device 420 may receive parallel data output from the first output driver 314 in the semiconductor device 410. The second decoder 322 may decode an output of the second receiver 321 and may restore the second parallel data D2N. The second descrambler 421 may descramble the second parallel data D2N and may restore the first parallel data D1N. The data storage unit 323 may store the restored first parallel data D1N.

In the example embodiment of FIG. 4, the second scrambler 422 may receive the first parallel data D1N from the data storage unit 323 and may convert the received first parallel data D1N into the second parallel data D2N having the given pattern of a pseudo-random binary sequence. The second encoder 324 may receive the second parallel data D2N and may generate M bits of third balance code D3M. The second output driver 325 may receive an output (e.g., D3M) of the second encoder 324 and may transmit the received output to the semiconductor device 410.

Accordingly, if N-bit parallel data is transmitted between semiconductor devices, scrambled N-bit parallel data may be stored in the data storage unit 323 illustrated in FIG. 3 while the N-bit parallel data, (e.g., descrambled data) may be stored in the data storage unit 323 illustrated in FIG. 4.

Figure 5:
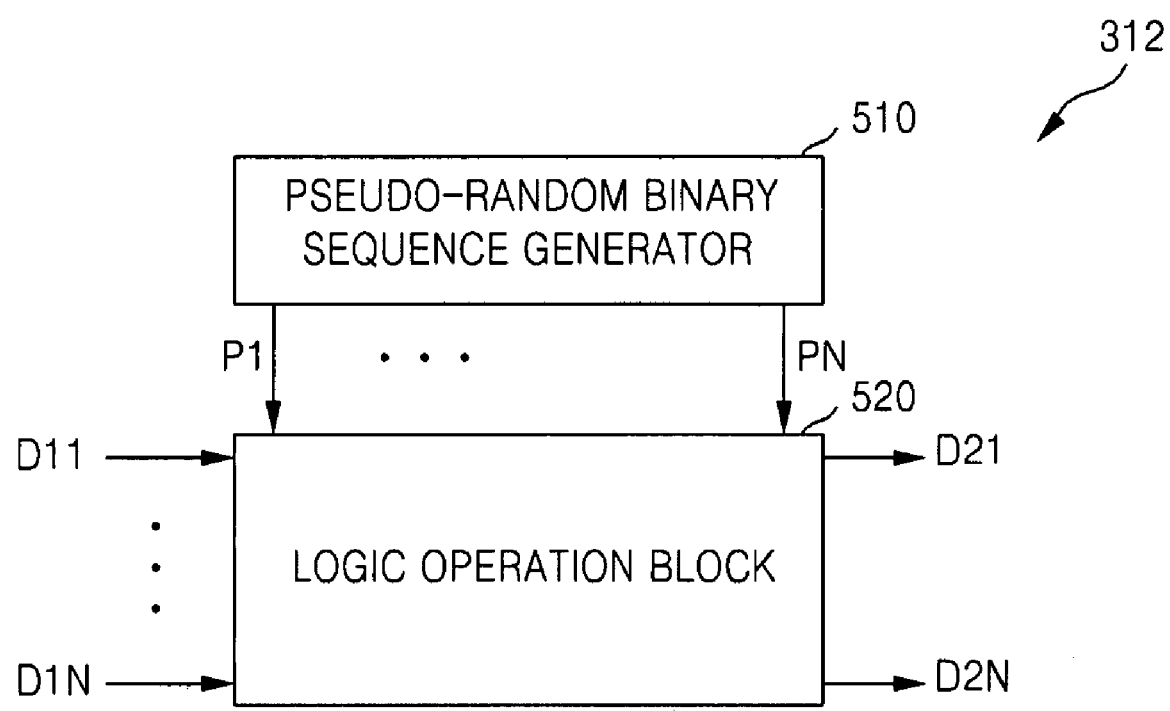
FIG. 5 is a detailed diagram of a scrambler according to another example embodiment of the present invention.

FIG. 5 is a detailed diagram of the first scrambler 312 illustrated in FIG. 3 according to another example embodiment of the present invention. In the example embodiment of FIG. 5, the first scrambler 312 may include a pseudo-random binary sequence generator 510 and a logic operation block 520. The pseudo-random binary sequence generator 510 may generate N bits P1 through PN of a pseudo-random binary sequence. The logic operation block 520 may perform a logic operation on N bits D11 through D1N of first parallel data and the N bits P1 through PN of the pseudo-random binary sequence. For example, the logic operation block 520 may perform an exclusive OR (XOR) operation on each of the N bits D11 through D1N of the first parallel data and the corresponding bit of N bits P1 through PN of the pseudo-random binary sequence. The logic operation block 520 may output N bits D21 through D2N of second parallel data based on a result of the logic operation (e.g., an XOR operation). Accordingly, the second parallel data may have an N-bit pseudo-random binary sequence.

In the example embodiment of FIGS. 3 through 5, in order to allow a receiving semiconductor device to descramble the second parallel data resulting from the scrambling performed by a transmitting semiconductor device, information (e.g., seed information) for generating the N bits P1 through PN of the pseudo-random binary sequence may be transmitted to the receiving semiconductor device. For example, if the N bits P1 through PN of the pseudo-random binary sequence are generated based on using, as a seed, an address transmitted from the transmitting semiconductor device to the receiving semiconductor device, separate seed information need not be transmitted.

In the example embodiment of FIGS. 3 through 5, a descrambler (e.g., the second descrambler 421 illustrated in FIG. 4) for descrambling N-bit parallel data scrambled by the first scrambler 312 may be implemented in the same manner as the first scrambler 312.

Figure 6A:
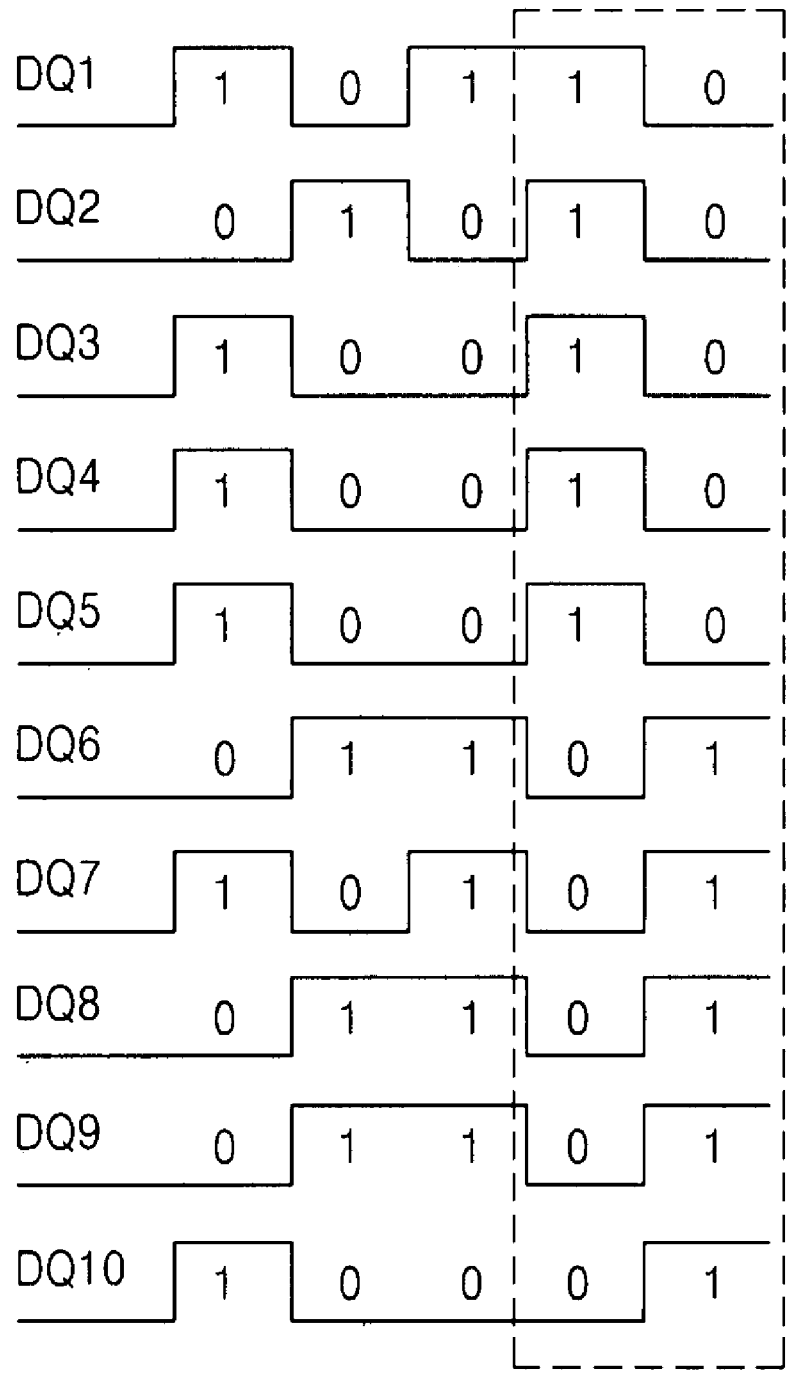
FIG. 6A illustrates conventionally 8B/10B-coded parallel data DQ1 through DQ10.
Figure 8:
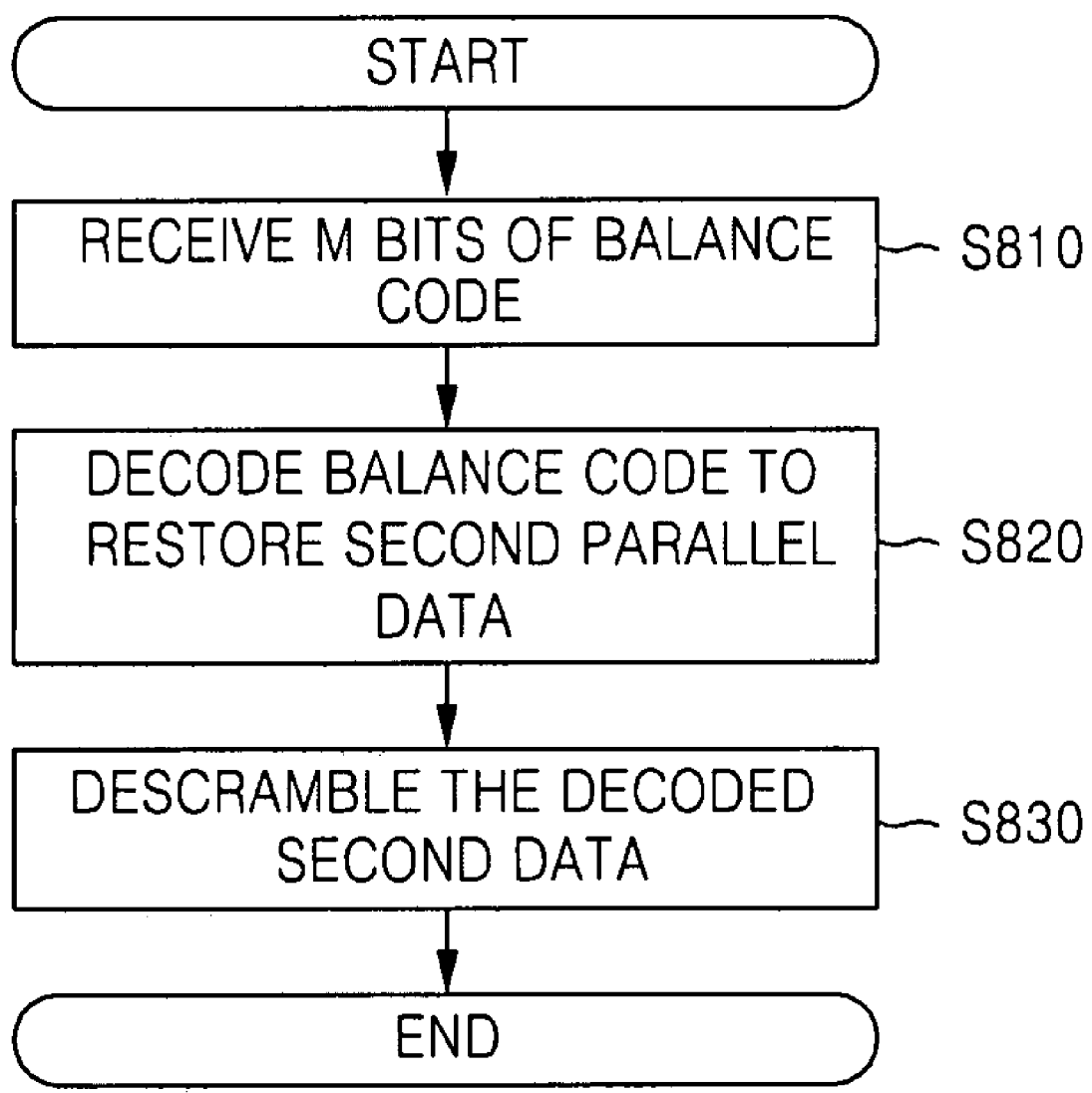
FIG. 8 is a flowchart of a process of receiving data using a single-ended parallel interface according to another example embodiment of the present invention.

FIG. 6A illustrates conventionally 8B/10B-coded parallel data DQ1 through DQ10. Referring to FIG. 6A, 8-bit parallel data may be converted into 10-bit parallel data DQ1 through DQ10 using conventional 8B/10B coding. A maximum difference between the number of bits set to the first logic level and the number of bits set to the second logic level in the 10-bit parallel data DQ1 through DQ10 transmitted during a single period may be 2. However, if each of the 10 bits in the parallel data DQ1 through DQ10 change in a given time domain, as illustrated by a dot-line box in FIG. 6A, switching noise may be increased to a higher level (e.g., maximized). Accordingly, an influence of electrical coupling between data signals transmitted through data channels increases, and crosstalk may also increase.

Figure 6B:
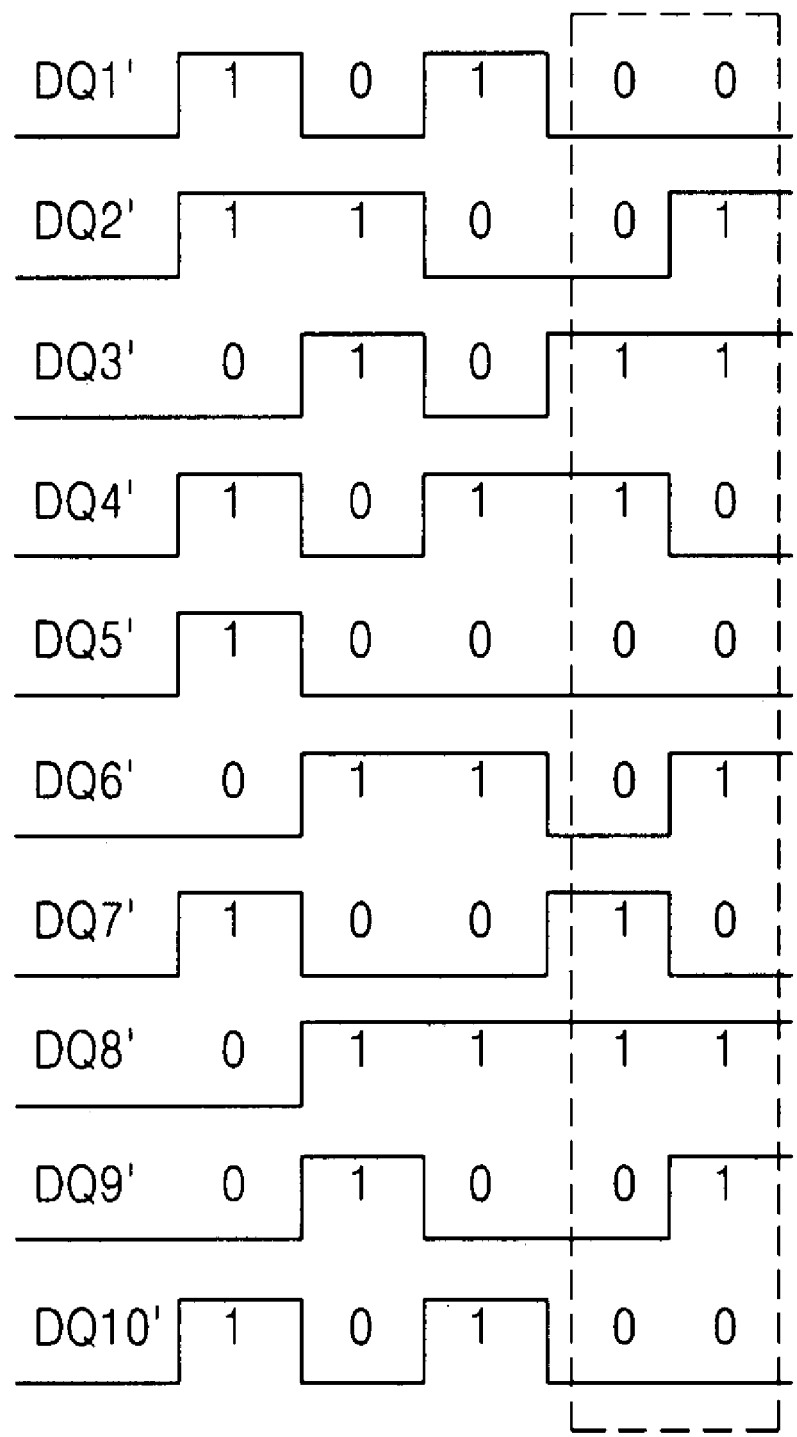
FIG. 6B illustrates parallel data DQ1' through DQ10' as a result of encoding performed using a combination of the first scrambler 312 illustrated in FIG. 3 and 8B/10B coding in accordance with another example embodiment of the present invention.

FIG. 6B illustrates parallel data DQ1' through DQ10' as a result of encoding performed using a combination of the first scrambler 312 illustrated in FIG. 3 and 8B/10B coding in accordance with another example embodiment of the present invention. In the example embodiments of FIGS. 3 and 6B, 8 bits of the first parallel data D1N (e.g., where N may equal 8) may be converted by the first scrambler 312 into the second parallel data D2N having a pattern in which positions of "0" bits and "1" bits may occur at random. The second parallel data D2N may be converted by the first encoder 313 using the 8B/10B coding into the first balance code D1M (e.g., DQ1' through DQ10' if M is 10) in which a maximum difference between the number of bits set to the first and second logic levels, respectively, may be 2. Accordingly, the first balance code D1M (e.g., DQ1' through DQ10') may experience a case as illustrated by the dot-line box of FIG. 6A relatively infrequently (e.g., less frequently than the conventional art) because the distribution is more likely to be "scrambled". In addition, as illustrated in the dot-line box shown in FIG. 6B, the probability that a value of each bit of the balance code DQ1' through DQ10' in a current period is different from a value of corresponding bit of the balance code DQ1' through DQ10' in a subsequent period may be, for example, 50%. Accordingly, if parallel data is encoded in accordance with example embodiments of the present invention, switching noise and crosstalk may be decreased during transmission.

Figure 6C:
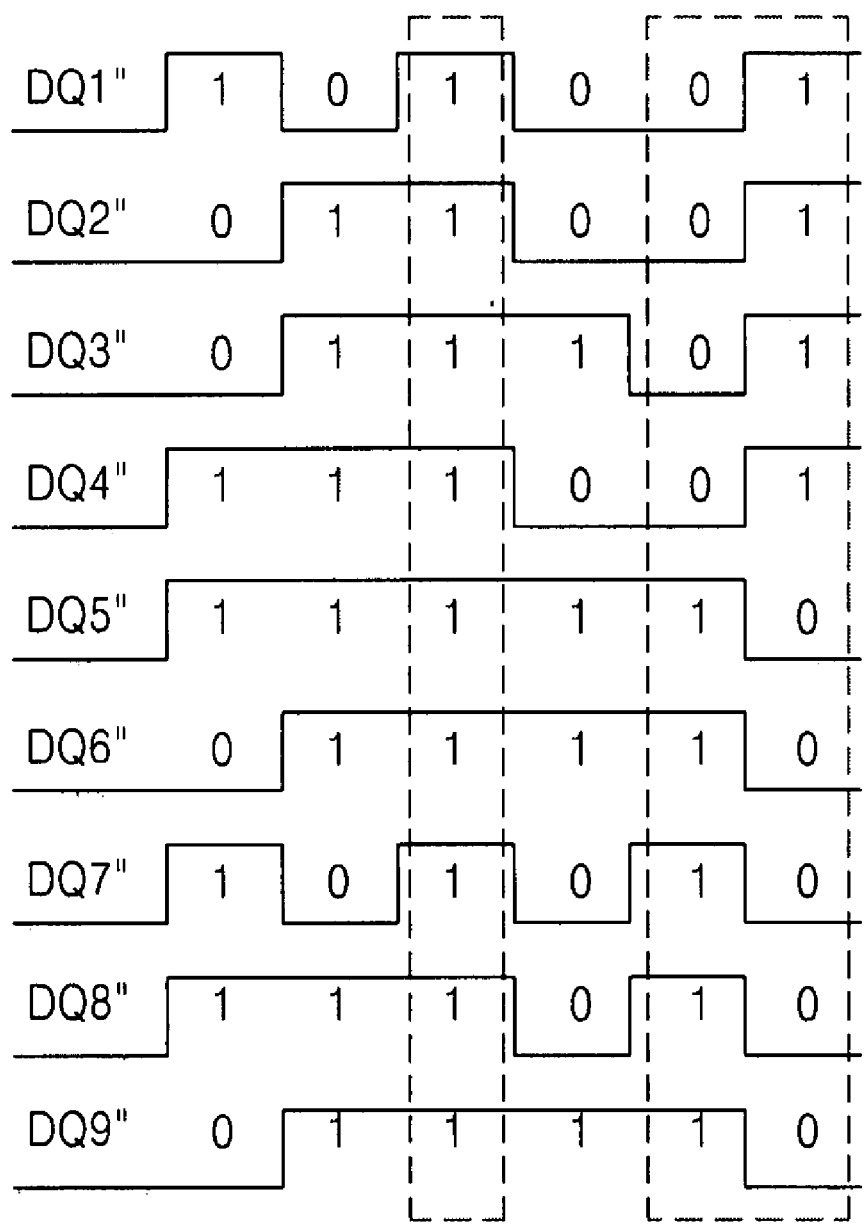
FIG. 6C illustrates conventional DBI-coded parallel data DQ1" through DQ9".

FIG. 6C illustrates conventional DBI-coded parallel data DQ1" through DQ9". Referring to FIG. 6C, 8-bit parallel data may be converted into 9-bit parallel data DQ1" through DQ9" using DBI coding. In a first dot-line box (e.g., on the left of the figure) illustrated in FIG. 6C, DC balance may not be maintained in the parallel data even if balance coding (e.g., DBI coding) is used. Moreover, if the 8-bit parallel data has either no bits or one bit set to the first logic level (e.g., a higher logic level or logic "1"), DC balance may not be maintained in the parallel data even if the DBI coding is used. Referring to conventional FIG. 6, in an example, the probability that DC balance may not be maintained in data may be 10/256. In addition, as illustrated in a second dot-line box (e.g., on the right of the figure) in FIG. 6C, if all of the 9 bits of the parallel data DQ1" through DQ9" change in the time domain, a switching noise may increase.

Figure 6D:
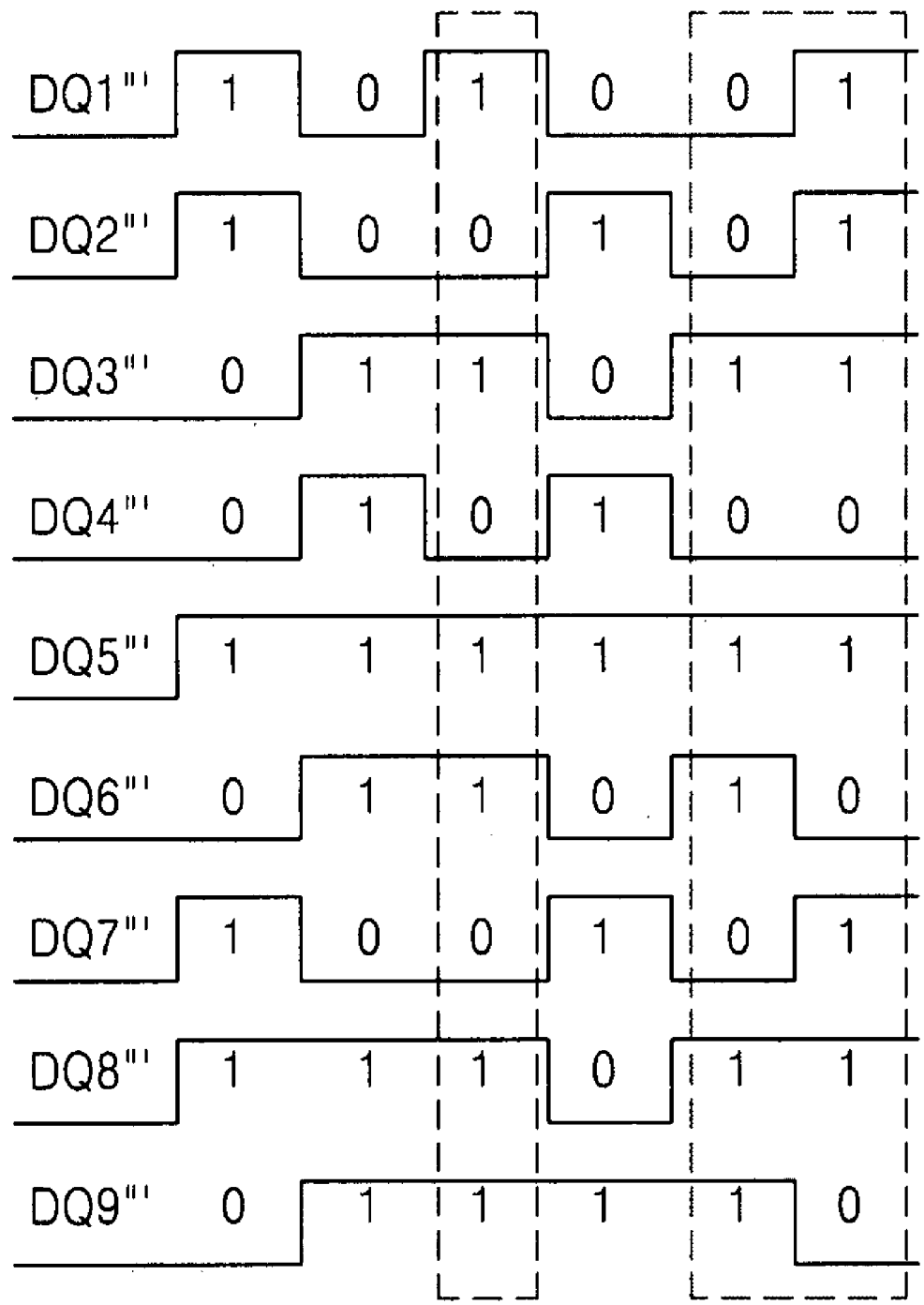
FIG. 6D illustrates parallel data DQ1''' through DQ9''' resulting from encoding using a combination of the scrambler illustrated in FIG. 3 and DBI coding, according to another example embodiment of the present invention.

FIG. 6D illustrates parallel data DQ1''' through DQ9''' resulting from encoding using a combination of the first scrambler 312 illustrated in FIG. 3 and DBI coding, according to another example embodiment of the present invention. In the example embodiment of FIGS. 3 and 6D, 8 bits of the first parallel data D1N (e.g., where N is 8) may be converted by the first scrambler 312 into the second parallel data D2N having a pattern in which position bits at first and second logic levels (e.g., 0s and 1s) are random. The second parallel data D2N may be DBI-coded by the first encoder 313. Accordingly, it may be unlikely (although possible) that the parallel data DQ1''' through DQ9''' resulting from the encoding in accordance with an example embodiment of the present invention may have patterns in the first and second dot-line boxes as illustrated in FIG. 6C, because the respective logic levels of the bits may be "scrambled" (e.g., randomly distributed) by the first scrambler 312. As a result, DC balance of parallel data may be maintained at a higher probability even if only, for example, 9 bits are used, without requiring an extra flag for maintaining DC balance, and also, switching noise may be decreased.

FIG. 7 is a flowchart of a process of transmitting data using a single-ended parallel interface according to another example embodiment of the present invention.

In the example embodiment of FIG. 7, N bits (e.g., where N is an integer at least equal to 2) of first parallel data may be received (at S710). The N bits of the first parallel data may be converted into second parallel data having a given pattern of a pseudo-random binary sequence (at S720). In an example, the second parallel data may be generated based on a result of performing a logic operation on the N bits of the first parallel data and a pseudo-random binary sequence generated to have the given pattern. M bits (e.g., where M>N) of a balance code may be generated (at S730) by selectively converting the second parallel data such that the number of bits set to the first logic level (e.g., a higher logic level or logic "1") in the balance code is within a given range (e.g., with respect to the number of bits set to the second logic level). In an example, the M bits of the balance code may be generated using 8B/10B coding or DBI coding. The M bits of the balance code may be transmitted in parallel through M data lines (at S740).

FIG. 8 is a flowchart of a process of receiving data using a single-ended parallel interface according to another example embodiment of the present invention. In the example embodiment of FIG. 8, M bits of a balance code may be received through M data lines (at S810). The M bits of the balance code may be decoded to restore second parallel data (at S820). The restored second parallel data may then be descrambled to restore first parallel data (at S830).

Figure 9A:
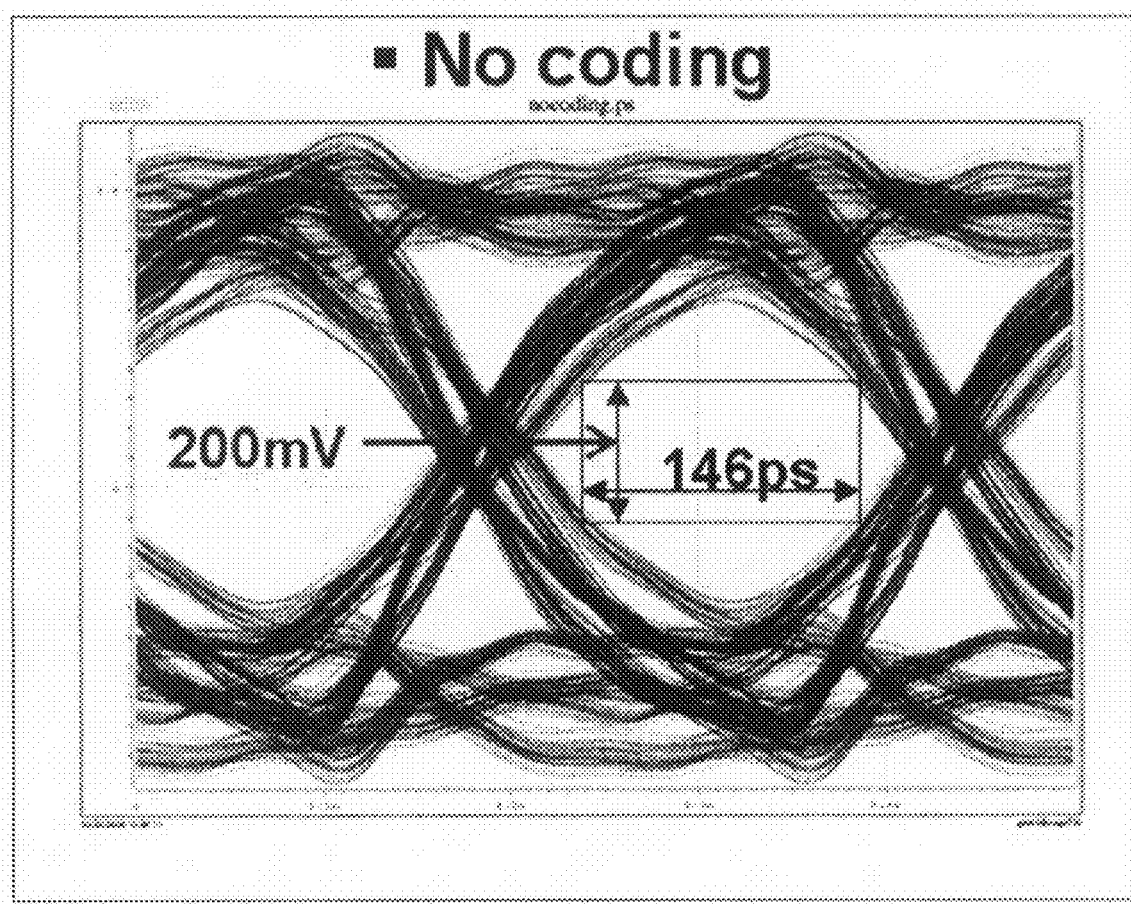
FIG. 9A is an eye diagram obtained under a conventional process if parallel data is not subjected to any coding according to another example embodiment of the present invention.
Figure 9B:
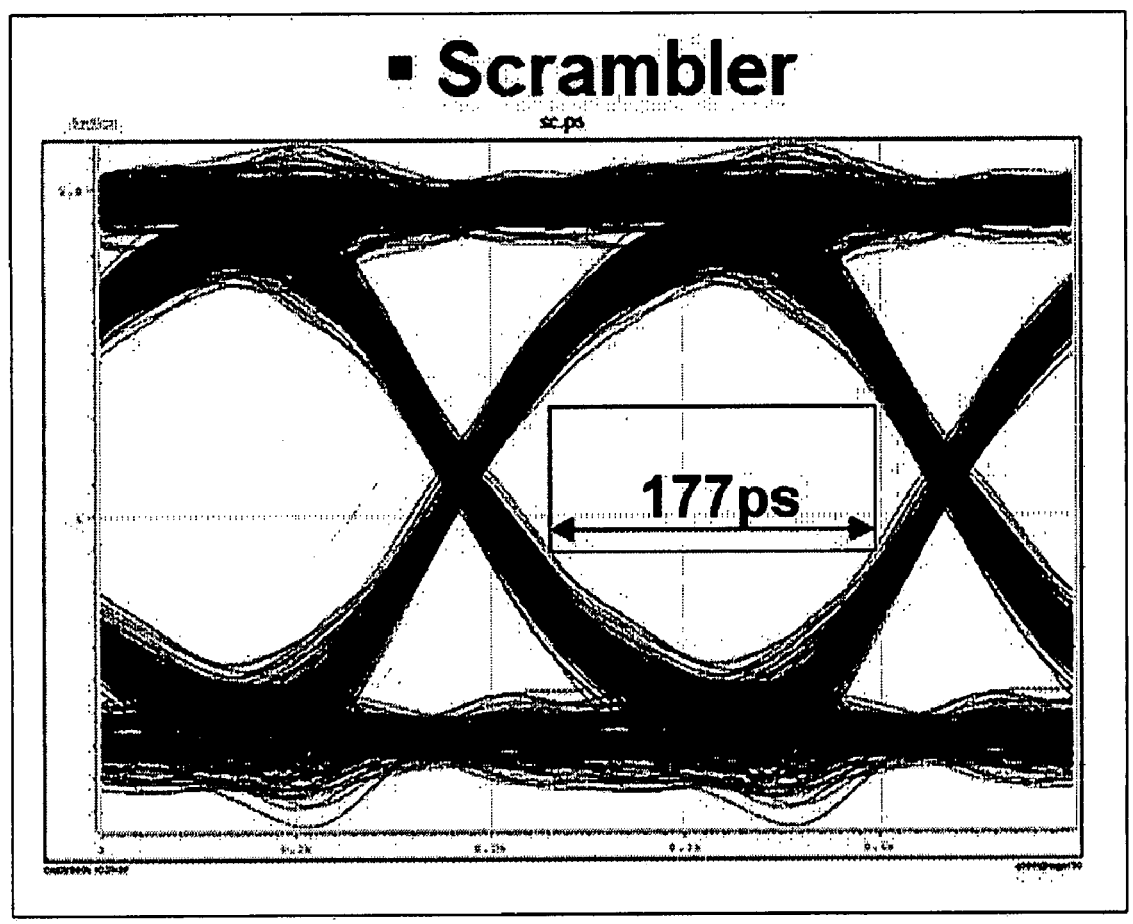
FIG. 9B is an eye diagram obtained under a conventional process if parallel data is scrambled by a scrambler.
Figure 9C:
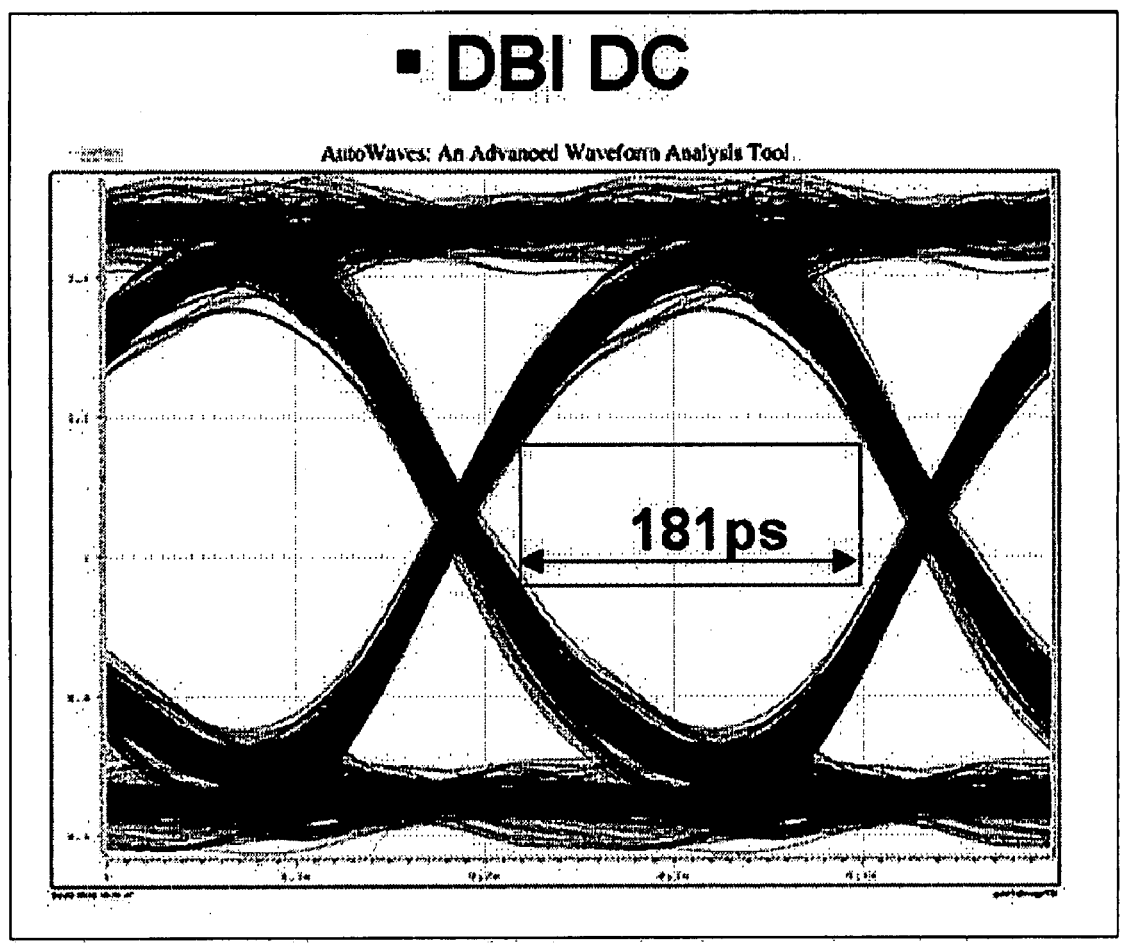
FIG. 9C is an eye diagram obtained under a conventional process if parallel data is subjected to DBI coding.
Figure 9D:
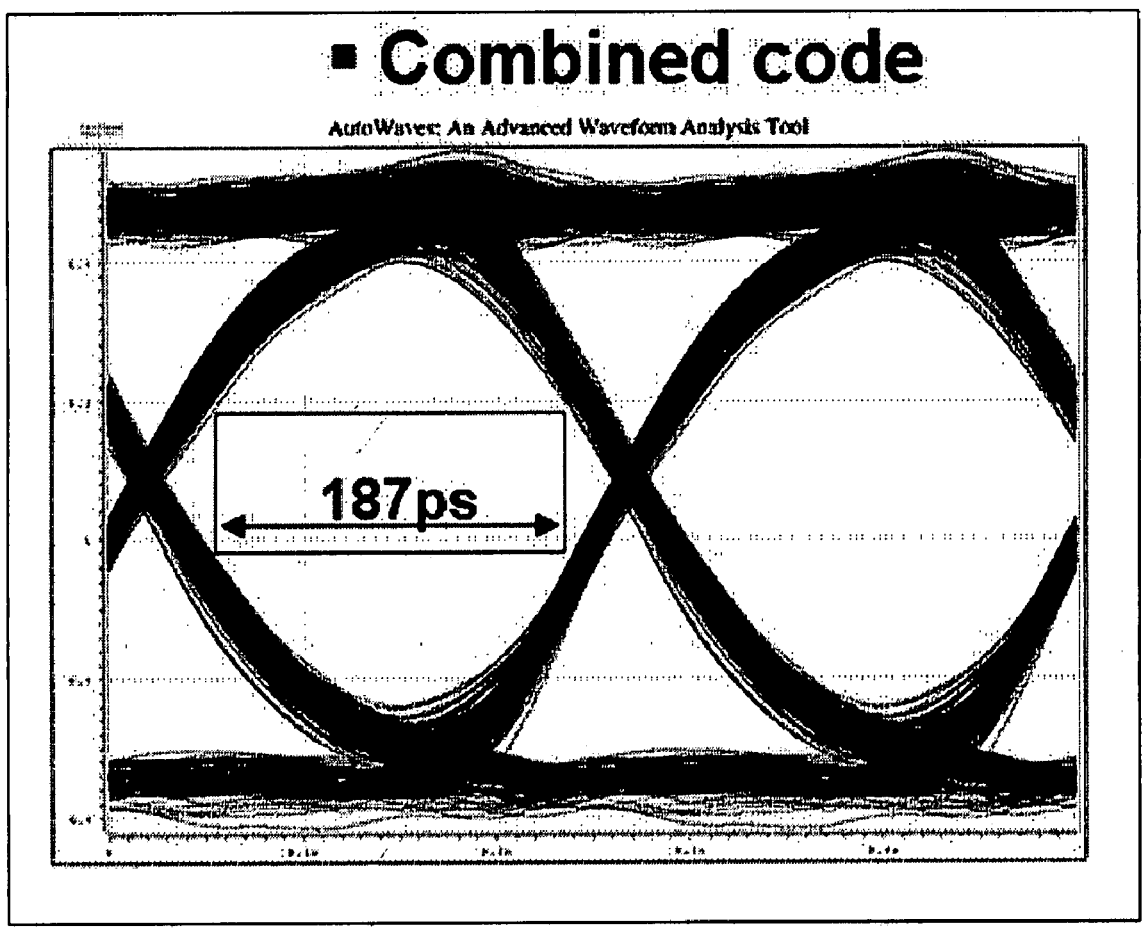
FIG. 9D is an eye diagram obtained if DBI coding and a scrambler are combined to perform coding according to another example embodiment of the present invention.

FIGS. 9A through 9D are eye diagrams illustrating parallel data input to a receiver with respect to coding types at a transmitter. FIG. 9A is an eye diagram obtained under a conventional process if parallel data is not subjected to any coding according to another example embodiment of the present invention. FIG. 9B is an eye diagram obtained under a conventional process if parallel data is scrambled by a scrambler. FIG. 9C is an eye diagram obtained under a conventional process if parallel data is subjected to DBI coding. In contrast, FIG. 9D is an eye diagram obtained if DBI coding and a scrambler are combined to perform coding according to another example embodiment of the present invention.

Upon a review of each of FIGS. 9A through 9D, the eye diagram illustrated in FIG. 9D may be the largest (e.g., 187 ps). Accordingly, it will be appreciated based upon a review of FIGS. 9A through 9D that if coding is performed according to an example embodiment of the present invention, jitter may be reduced and a voltage margin may be increased.

Although described primarily in terms of hardware above, the example methodology implemented by one or more components of the example system described above may also be embodied in software as a computer program. For example, a program in accordance with the example embodiments of the present invention may be a computer program product causing a computer to execute a method of encrypting input data by implementing a given encryption algorithm with a repeated round structure, as described above.

The computer program product may include a computer-readable medium having computer program logic or code portions embodied thereon for enabling a processor of the system to perform one or more functions in accordance with the example methodology described above. The computer program logic may thus cause the processor to perform the example method, or one or more functions of the example method described herein.

The computer-readable storage medium may be a built-in medium installed inside a computer main body or removable medium arranged so that it can be separated from the computer main body. Examples of the built-in medium include, but are not limited to, rewriteable non-volatile memories, such as RAM, ROM, flash memories and hard disks. Examples of a removable medium may include, but are not limited to, optical storage media such as CD-ROMs and DVDs; magneto-optical storage media such as MOs; magnetism storage media such as floppy disks (trademark), cassette tapes, and removable hard disks; media with a built-in rewriteable non-volatile memory such as memory cards; and media with a built-in ROM, such as ROM cassettes.

These programs may also be provided in the form of an externally supplied propagated signal and/or a computer data signal embodied in a carrier wave. The computer data signal embodying one or more instructions or functions of the example methodology may be carried on a carrier wave for transmission and/or reception by an entity that executes the instructions or functions of the example methodology. For example, the functions or instructions of the example method may be implemented by processing one or more code segments of the carrier wave in a computer controlling one or more of the components of the example system of FIGS. 3 and/or 5, in accordance with the example process outlined in any of FIGS. 7 and/or 8.

Further, such programs, when recorded on computer-readable storage media, may be readily stored and distributed. The storage medium, as it is read by a computer, may enable the processing of multimedia data signals prevention of copying these signals, allocation of multimedia data signals within an apparatus configured to process the signals, and/or the reduction of communication overhead in an apparatus configured to process multiple multimedia data signals, in accordance with the example method described herein.

In another example embodiment of the present invention, parallel data may be both scrambled and DC balance coded, whereby noise due to DC change and switching noise due to AC change in data may each be reduced. In addition, because parallel data may be DC balance coded and bits set to the first and second logic levels, respectively, may be spatially dispersed in the parallel data (e.g., to avoid conditions such as "1111111000000" or "0000000011111111", etc.), a return current from a printed circuit board (PCB) may be reduced. As a result, noise and crosstalk may also be reduced.

In another example embodiment of the present invention, parallel data may be encoded using a combination of a scrambler and DBI coding techniques, and such a combination may reduce a probability that DC balance may not be maintained in the parallel data. Accordingly, effective balance coding may be obtained using a limited number of bits (e.g., 9 bits) without having to reserve additional bits for a balance code.

Example embodiments of the present invention being thus described, it will be obvious that the same may be varied in many ways. For example, it is understood that the above-described first and second logic levels may correspond to a higher level and a lower logic level, respectively, in an example embodiment of the present invention. Alternatively, the first and second logic levels/states may correspond to the lower logic level and the higher logic level, respectively, in other example embodiments of the present invention.

Further, while above-described example embodiments are directed to first performing a scrambling operation (e.g., redistributing bits in a pseudo-random fashion) and then balancing the numbers of 0s and 1s within the scrambled bits, it is understood that other example embodiments of the present invention may first balance unscrambled bits and may then scramble the balanced bits. In other words, an order in which the balancing and scrambling operations are performed may be adjusted as necessary for any given application.

Such variations are not to be regarded as a departure from the spirit and scope of example embodiments of the present invention, and all such modifications as would be obvious to one skilled in the art are intended to be included within the scope of the following claims.

What is claimed is:

1. A method of reducing noise, comprising:
    receiving first parallel data, the first parallel data including a first plurality of bits arranged in a first order;
    scrambling the first plurality of bits included among the first parallel data to obtain second parallel data having the first plurality of bits arranged in a second order; and
    generating a balance code having a second plurality of bits by adding at least one additional bit to the first plurality of bits and adjusting a logic level of at least one of the first plurality of bits such that a difference between a first number of the second plurality of bits equal to a first logic level and a second number of the second plurality of bits equal to a second logic level is below a threshold.

2. The method of claim 1, further comprising:
    transmitting the balance code through a plurality of parallel data lines.

3. The method of claim 1, wherein generating of the scrambling the first plurality of bits includes:
    generating a pseudo-random binary sequence having a given pattern; and
    performing a logic operation on the first plurality of bits of the first parallel data and the pseudo-random binary sequence.

4. The method of claim 1, wherein generating the balance code is based on at least one of 8B/10B coding and data bus inversion coding.

5. The method of claim 2, further comprising:
    receiving the transmitted balance code; and
    extracting the second parallel data by decoding the received balance code; and
    storing the extracted second parallel data.

6. The method of claim 2, further comprising:
    receiving the balance code;
    extracting the second parallel data by decoding the received balance code;
    extracting the first parallel data by descrambling the extracting second parallel data; and
    storing the extracted first parallel data.

7. A recording medium for recording a program for executing the method of claim 1.

8. A semiconductor device, comprising:
    a scrambler receiving first parallel data, the first parallel data including a first plurality of bits arranged in a first order, and scrambling the first plurality of bits included among the first parallel data to obtain second parallel data having the first plurality of bits arranged in a second order; and
    a balance coding block generating a balance code having a second plurality of bits by performing one of adding at least one additional bit to the first plurality of bits and adjusting a logic level of at least one of the first plurality of bits such that a difference between a first number of the second plurality of bits equal to a first logic level and a second number of the second plurality of bits equal to a second logic level is below a threshold.

9. The semiconductor device of claim 8, further comprising:
    an output driver transmitting the balance code through a plurality of parallel data lines.

10. The semiconductor device of claim 8, wherein the scrambler includes:
    a pseudo-random binary sequence generator generating a pseudo-random binary sequence having a given pattern; and
    a logic operation block performing a logic operation on the first plurality of bits of the first parallel data and the pseudo-random binary sequence.

11. The semiconductor device of claim 10, wherein the logic operation block outputs the second parallel data based on a result of performing an exclusive OR (XOR) operation on each bit of the first parallel data and a corresponding bit of the pseudo-random binary sequence.

12. The semiconductor device of claim 8, wherein the balance coding block generates the balance code based on at least one of 8B/10B coding and data bus inversion coding.

13. A system, comprising:
    a first semiconductor device configured as the semiconductor device of claim 8; and
    a second semiconductor device including a data receiver receiving the generated balance code, a balance decoding block decoding the received balance code so as to obtain the first plurality of bits arranged in the second order, a first descrambler descrambling the extracted first plurality of bits of the first order to obtain the first plurality of bits arranged in the first order and a data storage unit storing the obtained first plurality of bits arranged in the first order.

14. The system of claim 13, wherein the first semiconductor device is a memory controller and the second semiconductor device is one of a dynamic random access memory (DRAM) device, a static RAM (SRAM) device and a flash memory device.

15. A semiconductor device, comprising:
    a data receiver receiving a balance code through a plurality of parallel data lines, the balance code including a second plurality of bits generated by scrambling a first plurality of bits arranged in a first order to generate the first plurality of bits arranged in a second order, and balancing the first plurality of bits arranged in the second order such that a difference between a first number of the second plurality of bits equal to a first logic level and a second number of the second plurality of bits equal to a second logic level is below a threshold;
    a balance decoding block decoding the received balance code so as to obtain the first plurality of bits arranged in the second order;
    a descrambler descrambling the extracted second plurality of bits so as to obtain the first plurality of bits arranged in the first order; and
    a data storage unit storing the obtained first plurality of bits arranged in the first order.

16. The semiconductor device of claim 15, wherein the balance decoding block decodes the balance code based on at least one of 8B/10B coding and data bus inversion coding.

17. The semiconductor device of claim 15, wherein the descrambler includes:
    a pseudo-random binary sequence generator generating a pseudo-random binary sequence having a given pattern; and
    a logic operation block performing a logic operation on the received balance code and the pseudo-random binary sequence.

18. A method of reducing noise, comprising:
receiving a balance code through a plurality of parallel data lines, the balance code including a second plurality of bits generated by scrambling a first plurality of bits arranged in a first order to generate a first plurality of bits arranged in a second order, and balancing the first plurality of bits arranged in the second order such that a difference between a first number of the second plurality of bits equal to a first logic level and a second number of the second plurality of bits equal to a second logic level is below a threshold;
decoding the received balance code so as to obtain the first plurality of bits arranged in the second order;
descrambling the extracted second plurality of bits so as to obtain the first plurality of bits arranged in the first order; and
storing the obtained first plurality of bits arranged in the first order.

19. A method of reducing noise, comprising:
receiving data scheduled for transmission;
scrambling an order of bits within the received data, the scrambled order arranged in accordance with a given pseudo-random sequence;
balancing the received data such that a difference between a first number of the bits within the received data equal to a first logic level and a second number of bits within the received data equal to a second logic level is below a threshold; and
transmitting the scrambled and balanced received data.

20. The method of claim 19, wherein the scrambling is performed before the balancing.

21. The method of claim 19, wherein the balancing is performed before the scrambling.

* * * * *